United States Patent
Kim et al.

(10) Patent No.: US 9,076,706 B2
(45) Date of Patent: Jul. 7, 2015

(54) IMAGE SENSOR BASED ON DEPTH PIXEL STRUCTURE

(75) Inventors: Seong Jin Kim, Seoul (KR); Sang Wook Han, Busan (KR); Albert Theuwissen, Bree (BE)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 461 days.

(21) Appl. No.: 13/343,976

(22) Filed: Jan. 5, 2012

(65) Prior Publication Data

US 2012/0175685 A1    Jul. 12, 2012

Related U.S. Application Data

(60) Provisional application No. 61/493,038, filed on Jun. 3, 2011.

(30) Foreign Application Priority Data

Jan. 7, 2011   (KR) .................. 10-2011-0001758
Dec. 29, 2011  (KR) .................. 10-2011-0146125

(51) Int. Cl.
*H01L 27/146*    (2006.01)

(52) U.S. Cl.
CPC .... *H01L 27/14641* (2013.01); *H01L 27/14603* (2013.01); *H01L 27/14612* (2013.01)

(58) Field of Classification Search
CPC ............ H01L 27/14603; H01L 27/146; H01L 27/14605; H01L 27/14643
USPC .......................... 257/255, E27.155
See application file for complete search history.

(56) References Cited

U.S. PATENT DOCUMENTS

2007/0069258 A1 *  3/2007  Ahn ............................ 257/290

FOREIGN PATENT DOCUMENTS

| JP | 2008-167178 | 7/2008 |
|---|---|---|
| JP | 2010-213231 | 9/2010 |
| KR | 10-0592619 | 6/2006 |
| KR | 10-2009-0009845 | 1/2009 |
| KR | 10-2009-0102398 | 9/2009 |
| KR | 10-2009-0110729 | 10/2009 |
| KR | 10-2009-0118795 | 11/2009 |
| KR | 10-2010-0011676 | 2/2010 |
| KR | 10-2010-0033368 | 3/2010 |

OTHER PUBLICATIONS

Tubert et al., "High Speed Dual Port Pinned-Photodiode for Time-Of-Flight Imaging", Proceeding on International Image Sensor Workshop, 2009.

* cited by examiner

*Primary Examiner* — Elias M Ullah

(74) *Attorney, Agent, or Firm* — Harness, Dickey & Pierce, P.L.C.

(57) ABSTRACT

An image sensor based on a depth pixel structure is provided. The image sensor may include a pixel including a photodiode, and the photodiode may include a transfer gate to transfer, to a floating diffusion node, an electron generated by a light reflected from an object.

32 Claims, 15 Drawing Sheets

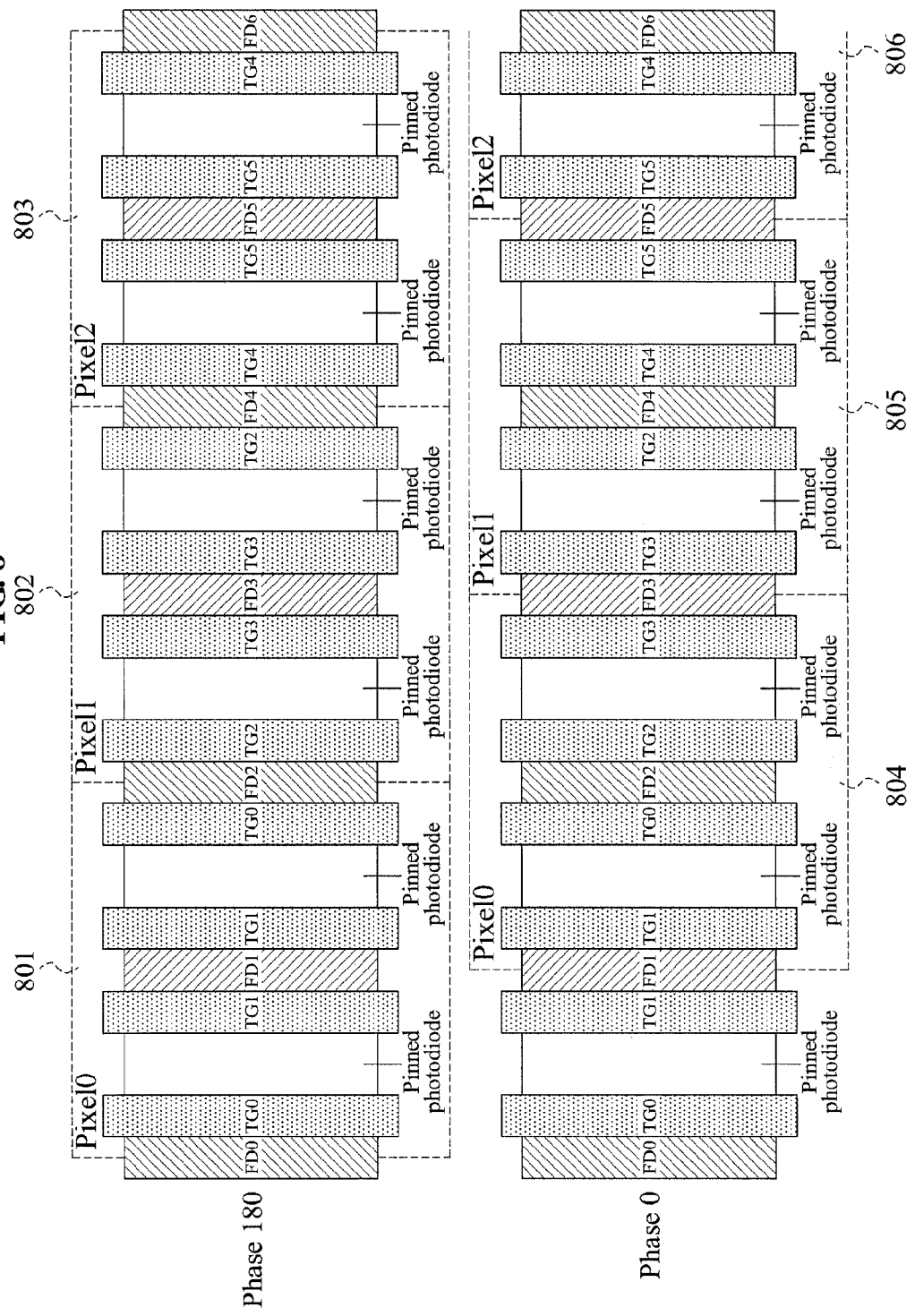

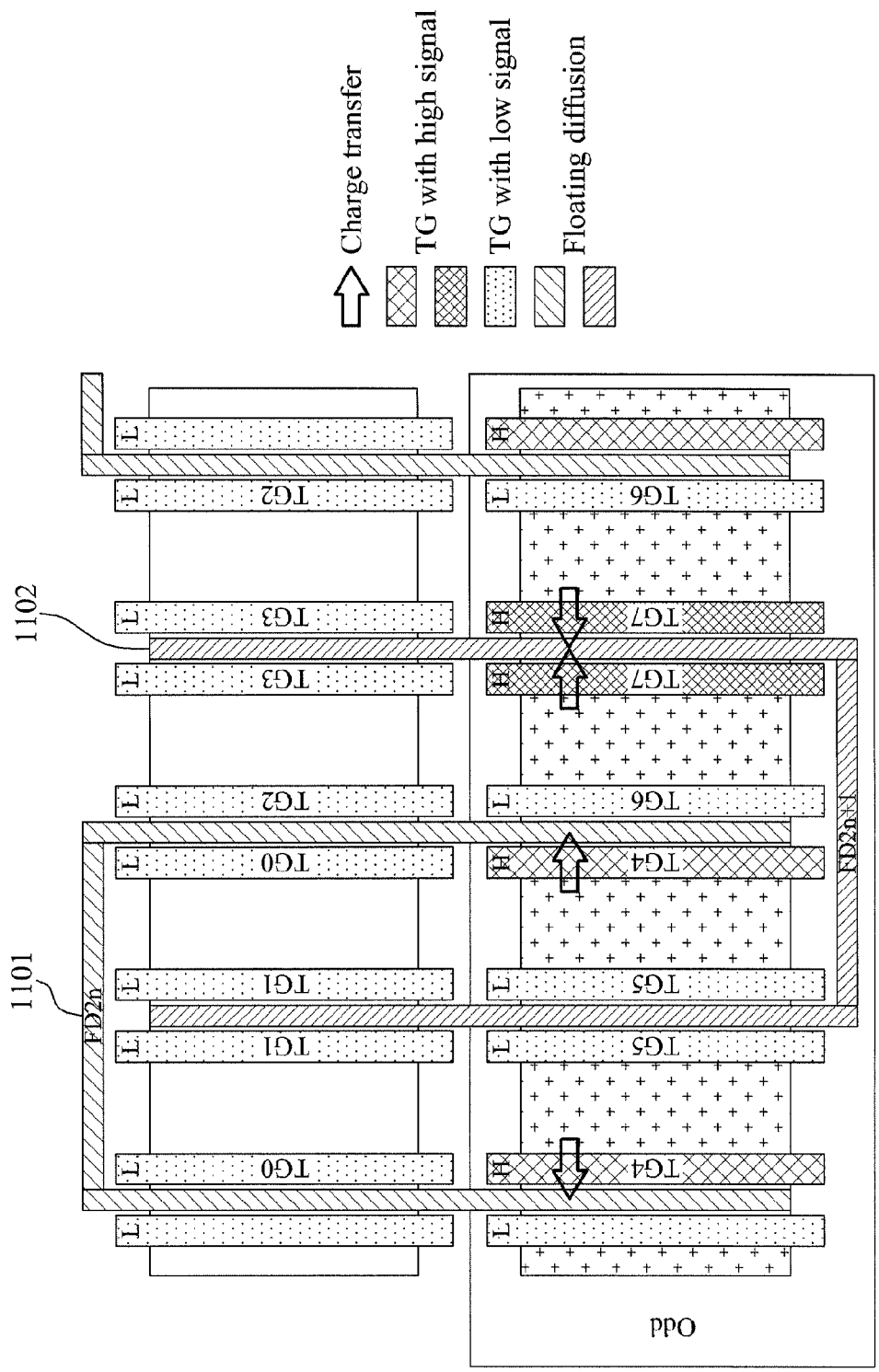

IMAGE SENSOR BASED ON DEPTH PIXEL STRUCTURE

CROSS-REFERENCE TO RELATED APPLICATION

This application claims the benefit of U.S. Provisional Application No. 61/493,038, filed on Jun. 3, 2011, the disclosure of which is incorporated herein by reference in its entirety.

This application claims the benefit of Korean Patent Application No. 10-2011-0001758, filed on Jan. 7, 2011, and Korean Patent Application No. 10-2011-0146125, filed on Dec. 29, 2011, in the Korean Intellectual Property Office, the disclosures of which are incorporated herein by reference in their entireties.

BACKGROUND

1. Field

Example embodiments of the following description relate to an image sensor based on a depth pixel structure, and more particularly, an image sensor having a pixel structure that may sense depth information based on Time-of-Flight (TOF).

2. Description of the Related Art

A method of acquiring information regarding a distance from a sensor to an object may be broadly classified into an active scheme and a passive scheme. The active scheme may typically include a Time-of-Flight (TOF) scheme of measuring a travel time of a light by detecting the light radiated to an object and reflected and returned from the object, and a triangulation scheme of detecting a location of a light radiated and reflected from an object by a laser spaced by a predetermined distance from a sensor, and of calculating a distance to the object using a triangulation. The passive scheme may typically include a scheme of calculating a distance to an object based on only image information, not radiating a light, and may be employed in a stereo camera.

In a distance measurement scheme as described above, a TOF-based sensor may be advantageous in acquiring a depth image in real time. In particular, a scheme of obtaining a TOF is being widely used by radiating a modulated light having a predetermined frequency and a predetermined waveform, and by demodulating a light reflected from an object in a detector.

To perform demodulation indispensable for a TOF, a generated electron is required to be transferred within an extremely short period of time in a photodiode. Accordingly, there is a desire for a method that may efficiently, inexpensively fabricate a structure for transferring an electron within an extremely short period of time in a photodiode.

SUMMARY

The foregoing and/or other aspects are achieved by providing an image sensor including a pixel including a photodiode, wherein a transfer gate is located in each of all sides of the photodiode.

The foregoing and/or other aspects are also achieved by providing an image sensor including a pixel including a photodiode, wherein different transfer gates are respectively located in two sides of the photodiode.

The foregoing and/or other aspects are also achieved by providing an image sensor including a pixel including a photodiode, wherein different transfer gates are respectively located in two facing sides of the photodiode.

The foregoing and/or other aspects are also achieved by providing an image sensor including a pixel including a photodiode, wherein the photodiode is divided into at least two segments by a transfer gate and a floating diffusion node.

The foregoing and/or other aspects are also achieved by providing an image sensor including a plurality of pixels to enable a transfer gate to transfer, to a floating diffusion node, an electron generated by a light reflected from an object, the plurality of pixels sharing the floating diffusion node with each other.

Additional aspects, features, and/or advantages of example embodiments will be set forth in part in the description which follows and, in part, will be apparent from the description, or may be learned by practice of the disclosure.

BRIEF DESCRIPTION OF THE DRAWINGS

These and/or other aspects and advantages will become apparent and more readily appreciated from the following description of the example embodiments, taken in conjunction with the accompanying drawings of which:

FIG. 8 illustrates a diagram of a split-type pixel structure with a phase difference of 180° according to example embodiments;

FIG. 11 illustrates a diagram of an operation of acquiring a color image from pixels placed in an odd row according to example embodiments.

DETAILED DESCRIPTION

Figure 1:
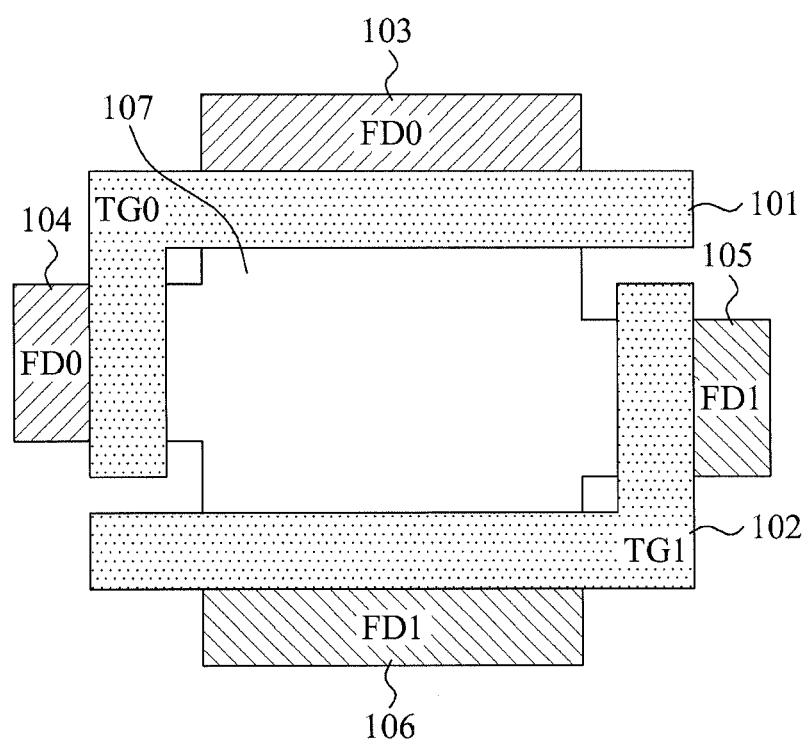
FIG. 1 illustrates a diagram of a layout of a cover-type pixel structure according to example embodiments.

Reference will now be made in detail to example embodiments, examples of which are illustrated in the accompanying drawings, wherein like reference numerals refer to the like elements throughout. Example embodiments are described below to explain the present disclosure by referring to the figures.

FIG. 1 illustrates a diagram of a layout of a cover-type pixel structure according to example embodiments.

Referring to FIG. 1, the cover-type pixel structure may be associated with a single pixel forming an image sensor. Transfer gates may be located in all sides of a photodiode 107 in the pixel, and floating diffusion nodes may be located adjacent to the transfer gates. Here, the photodiode 107 may be, for example, a pinned photodiode.

Specifically, a first transfer gate (TG0) 101 may be located in one half of the sides of the photodiode 107, and a second transfer gate (TG1) 102 may be located in the other half. Additionally, the first transfer gate 101 may be located adjacent to first floating diffusion nodes (FD0) 103 and 104, and the second transfer gate 102 may be located adjacent to second floating diffusion nodes (FD1) 105 and 106. Since the first transfer gate 101 and the second transfer gate 102 are located in all of the sides of the photodiode 107, it is possible to perform Time-of-Flight (TOF) demodulation of an optical signal.

FIG. 1 illustrates merely an example of the cover-type pixel structure, and the example embodiments may include a structure in which transfer gates are located in all sides of a photodiode, and in which floating diffusion nodes are adjacent to the transfer gates.

Figure 2:
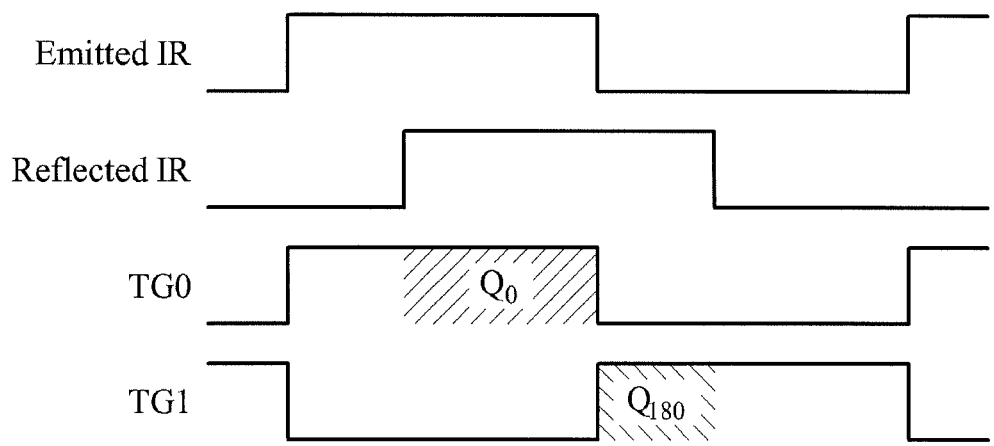
FIG. 2 illustrates a timing diagram based on a cover-type pixel structure according to example embodiments.

FIG. 2 illustrates a timing diagram based on a cover-type pixel structure according to example embodiments.

Specifically, FIG. 2 illustrates the timing diagram of a light emitted onto an object, for example an emitted Infrared Ray (IR), and a light reflected from an object, for example a reflected IR. A TOF may indicate an interval between the emitted IR and the reflected IR.

Additionally, $Q_0$ may indicate an amount of electric charges accumulated by moving an electron generated by the reflected IR via the first transfer gate 101 of FIG. 1 to the first floating diffusion nodes 103 and 104 of FIG. 1. Furthermore, $Q_{180}$ may indicate an amount of electric charges accumulated by moving an electron generated by the reflected IR via the second transfer gate 102 of FIG. 1 to the second floating diffusion nodes 105 and 106 of FIG. 1.

Referring to FIG. 2, a timing diagram for a transfer gate TG0 may be identical to a timing diagram for the emitted IR. Additionally, a phase difference between the timing diagram for the transfer gate TG0 and a timing diagram for a transfer gate TG1 may be 180°.

$Q_0$ may be determined using Equation 1 below. Additionally, $Q_{180}$ may be determined using Equation 2 below.

$$Q_0 = \frac{N_0}{n} \quad \text{[Equation 1]}$$
$$N_0 = n(T_{on} - T_{TOF})i_{ir}$$

$$Q_1 = \frac{N_1}{n} \quad \text{[Equation 2]}$$
$$N_1 = nT_{TOF}i_{ir}$$

The TOF may be determined as shown in the following Equation 3:

$$\frac{N_0}{N_1} = \frac{T_{on} - T_{TOF}}{T_{TOF}} \Rightarrow T_{TOF} = T_{on}\frac{N_1}{N_0 + N_1} \quad \text{[Equation 3]}$$

A depth R may be finally derived as shown in the following Equation 4:

$$R = \frac{c}{2}T_{TOF} = \frac{cT_{on}}{2} \cdot \frac{N_1}{N_0 + N_1} = R_{max}\frac{N_1}{N_0 + N_1} = R_{max}\frac{N_1}{N_{electron}} = R_{max} \quad \text{[Equation 4]}$$

In the cover-type pixel structure of FIG. 1, since the transfer gates are located in all of the sides of the photodiode 107, an electron movement distance may be shortened, and an electron transfer speed may be improved. Accordingly, a TOF depth sensing capacity of an image sensor may also be improved.

Figure 3A:
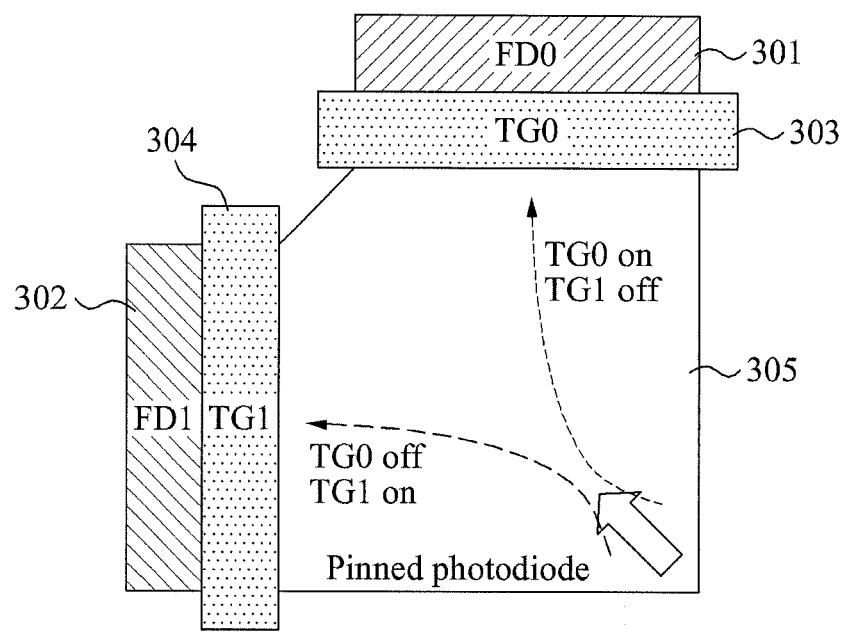
FIGS. 3A and 3B illustrate diagrams of layouts of diamond-type pixel structures according to example embodiments.
Figure 3B:
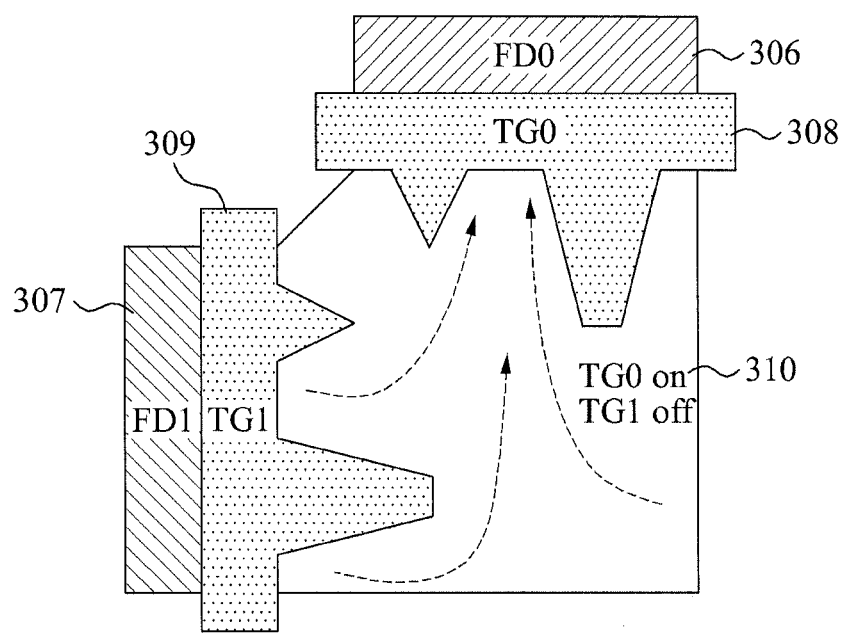

FIGS. 3A and 3B illustrate diagrams of layouts of diamond-type pixel structures according to example embodiments.

In the cover-type pixel structure of FIG. 1, since the transfer gates are located in all of the sides of the photodiode 107, the electron transfer speed may be improved. However, an area of the photodiode 107 may be reduced due to the transfer gates and thus, a fill factor associated with improvement of a sensitivity of a photodiode may be reduced.

In FIGS. 3A and 3B, different transfer gates, namely a transfer gate (TG0) 303 and a transfer gate (TG1) 304, may be located in two sides of a photodiode 305, and different transfer gates, namely a transfer gate (TG0) 308 and a transfer gate (TG1) 309, may be located in two sides of a photodiode 310. Additionally, a floating diffusion node (FD0) 301 and a floating diffusion node (FD1) 302 may be respectively located adjacent to the transfer gates 303 and 304, and a floating diffusion node (FD0) 306 and a floating diffusion node (FD1) 307 may be respectively located adjacent to the transfer gates 308 and 309. Thus, the diamond-type pixel structures of FIGS. 3A and 3B may be different from the cover-type pixel structure of FIG. 1. Here, the photodiodes 305 and 310 may be, for example, pinned photodiodes.

In the diamond-type pixel structures of FIGS. 3A and 3B, since two different transfer gates may be located in two sides of a photodiodes, a fill factor may be increased, compared with the cover-type pixel structure of FIG. 1. For example, different transfer gates may be located in two sides of a photodiode.

Additionally, in the diamond-type pixel structures of FIGS. 3A and 3B, an electron movement direction may be changed based on whether the transfer gates 303, 304, 308, and 309 are turned on or off. Specifically, in FIG. 3A, when the transfer gate 303 is turned on, an electron may move to the transfer gate 303. Additionally, when the transfer gate 304 is turned on, an electron may move to the transfer gate 304.

Referring to FIGS. 3A and 3B, since an area of each of the photodiodes 305 and 310 is widened in a lateral direction, that is, from an edge to a center portion of each of the photodiodes 305 and 310, a pinning voltage formed as a fixed voltage in each of the photodiodes 305 and 310 may be increased in the lateral direction. Accordingly, an electron movement speed may be increased based on a drift force by the pinning voltage formed in each of the photodiodes 305 and 310.

In particular, the transfer gates 308 and 309 of FIG. 3B are formed to further protrude to the photodiode 310, compared with the transfer gates 303 and 304 of FIG. 3A. Specifically, as the transfer gates 308 and 309 protrude to the photodiode 310, the pinning voltage formed in the photodiode 310 may be noticeably changed, compared with the photodiode 305. Additionally, the area of the photodiode 310 may be reduced due to protruding regions of the transfer gates 308 and 309 and thus, the fill factor may be reduced. Accordingly, protruding regions of transfer gates may be designed with various shapes depending on an application.

Figure 4A:
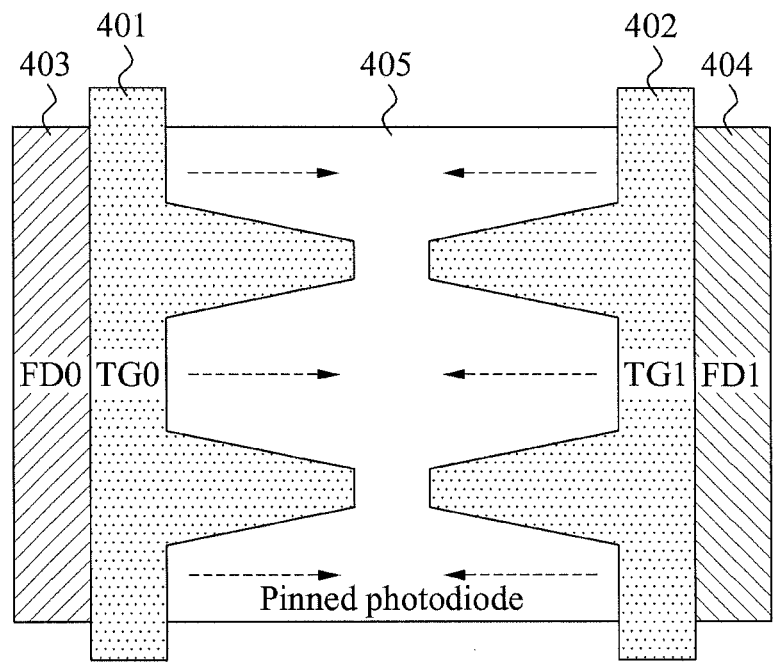
FIGS. 4A and 4B illustrate diagrams of layouts of finger-type pixel structures according to example embodiments.
Figure 4B:
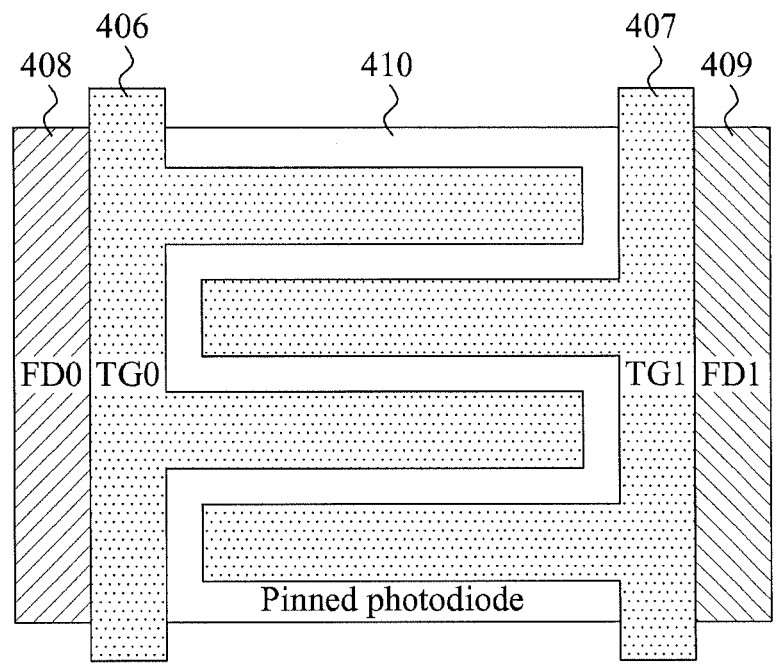

FIGS. 4A and 4B illustrate diagrams of layouts of finger-type pixel structures according to example embodiments.

In finger-type pixel structures of FIGS. 4A and 4B, different transfer gates, namely a transfer gate (TG0) 401 and a transfer gate (TG1) 402, may be located in two facing sides of a photodiode 405, and different transfer gates, namely a transfer gate (TG0) 406 and a transfer gate (TG1) 407, may be located in two facing sides of a photodiode 410. Additionally, a floating diffusion node (FD0) 403 and a floating diffusion node (FD1) 404 may be respectively located adjacent to the transfer gates 401 and 402, and a floating diffusion node (FD0) 408 and a floating diffusion node (FD1) 409 may be respectively located adjacent to the transfer gates 406 and 407. Here, the photodiodes 405 and 410 may be, for example, pinned photodiodes.

Referring to FIGS. 4A and 4B, transfer gates 401, 402, 406, and 407 may be formed to protrude to center portions of the photodiodes 405 and 410. Areas of the photodiodes 405 and 410 may be adjusted by protruding regions of the transfer gates 401, 402, 406, and 407. Additionally, a pinning voltage in each of the photodiodes 405 and 410 may be increased from both sides to the center portion of each of the photodiodes 405 and 410. Furthermore, an electron moved to the center portion by the pinning voltage may be moved to either the floating diffusion nodes 403 and 408, or the floating diffusion nodes 404 and 409, based on whether either the transfer gates 401 and 406, or the transfer gates 402 and 407 are turned on or off.

Here, compared with the transfer gates 401 and 402 of FIG. 4A, protruding regions of the transfer gate 406 may be extended to the transfer gate 407, and protruding regions of the transfer gate 407 may be extended to the transfer gate 406. In other words, in the pixel structure of FIG. 4B, an electron movement path may be shorter than that of the pixel structure of FIG. 4A and accordingly, an effect of an extremely high electron transfer speed may be expected. However, an area of the photodiode 410 may be reduced due to the protruding regions and thus, a fill factor may be reduced.

Figure 5A:
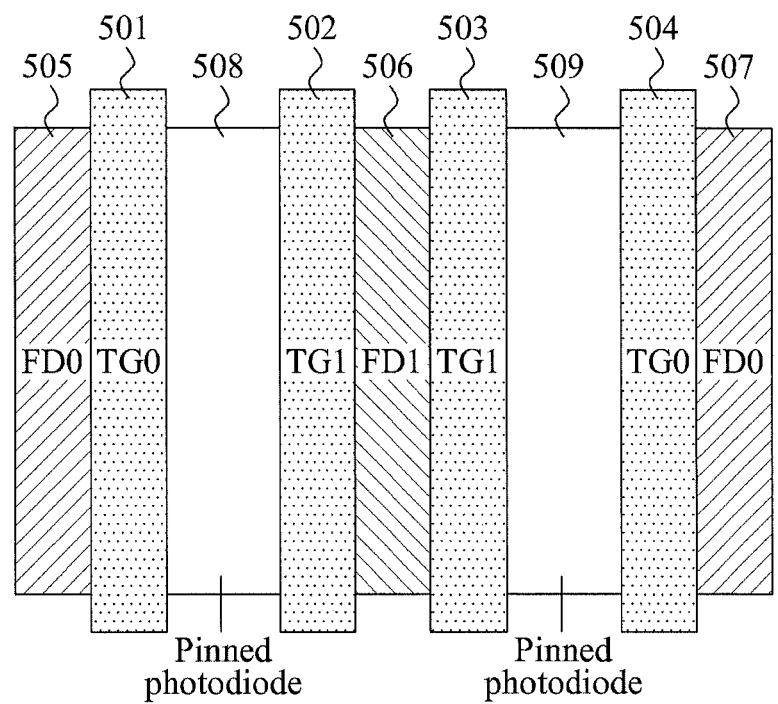
FIGS. 5A and 5B illustrate diagrams of layouts of split-type pixel structures according to example embodiments.
Figure 5B:
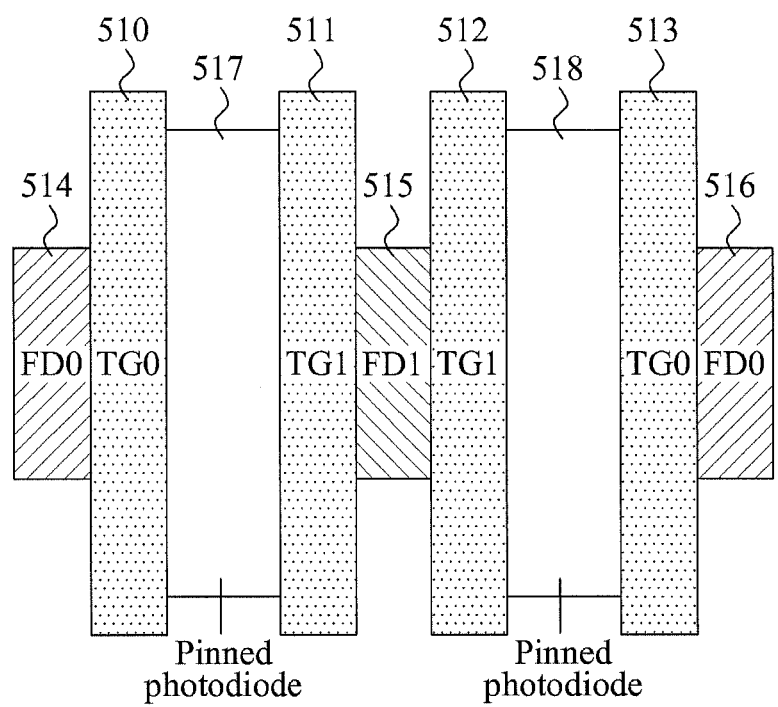

FIGS. 5A and 5B illustrate diagrams of layouts of split-type pixel structures according to example embodiments.

In a split-type pixel structure of FIG. 5A, a photodiode may be divided into at least two segments, namely, photodiodes 508 and 509 by transfer gates (TG1) 502 and 503, and a floating diffusion node (FD1) 506. Similarly, in a split-type pixel structure of FIG. 5B, a photodiode may be divided into at least two segments, namely, photodiodes 517 and 518 by transfer gates (TG1) 511 and 512, and a floating diffusion node (FD1) 515.

The pixel structures of FIGS. 1 through 4 may be formed by changing structures of transfer gates, to improve the electron transfer speed. The pixel structures of FIGS. 5A and 5B may be formed by dividing a photodiode into at least two segments. A photodiode may be divided into a plurality of segments, based on a size of a pixel.

Floating diffusion nodes (FD0) 514 and 516, and the floating diffusion node 515 of FIG. 5B may be smaller in size than floating diffusion nodes (FD0) 505 and 507, and the floating diffusion node 506 of FIG. 5A. In other words, in the pixel structure of FIG. 5B, to prevent a sensitivity from being reduced due to a reduction in areas of the photodiodes 517 and 518, the size of the floating diffusion nodes 514, 515, and 516 may be reduced.

Figure 6:
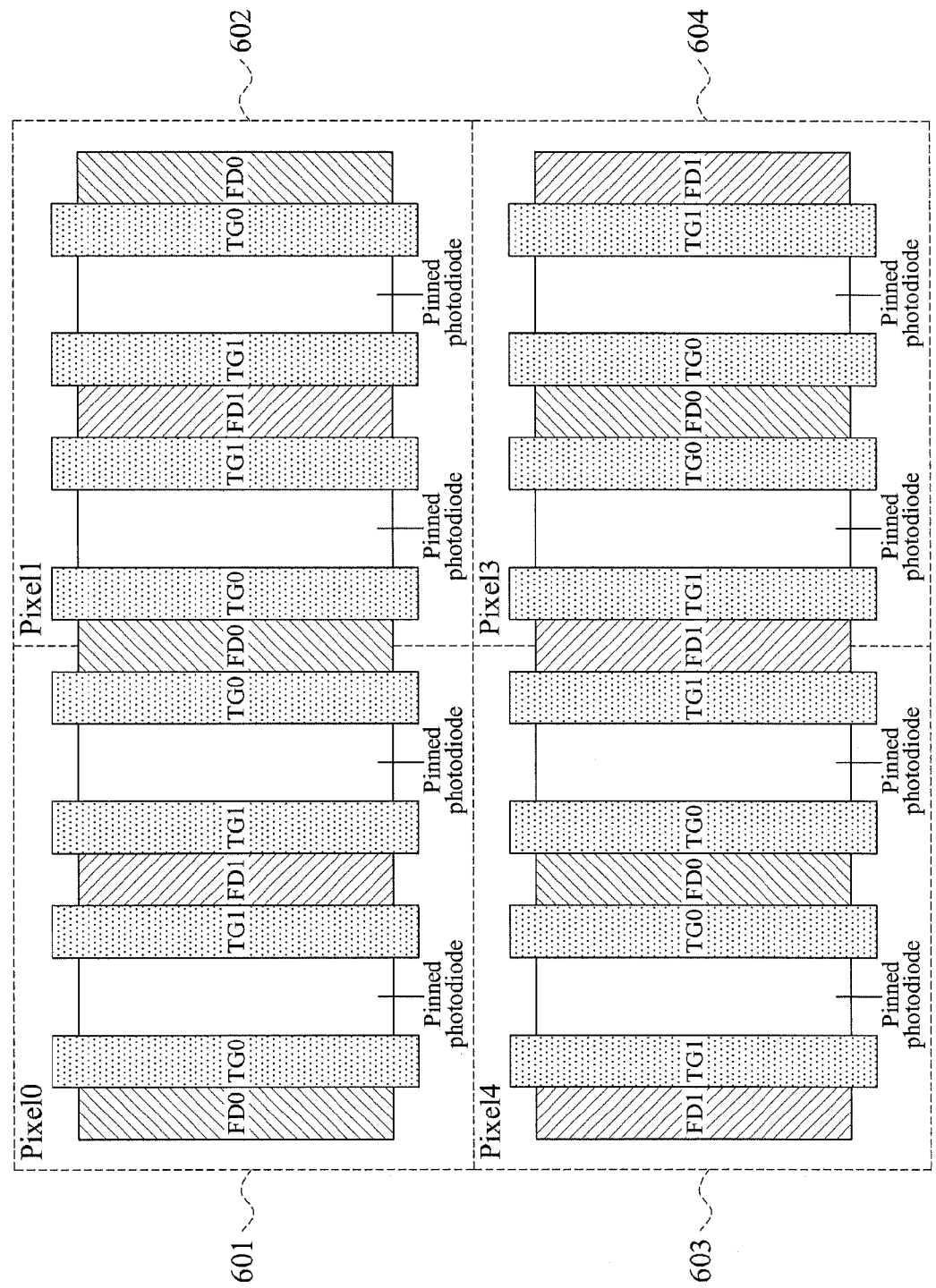
FIG. 6 illustrates a diagram of a 2×2 pattern of pixels having the split-type pixel structure of FIG. 5A.

FIG. 6 illustrates a diagram of a 2×2 pattern of pixels having the split-type pixel structure of FIG. 5A.

Specifically, FIG. 6 illustrates a pixel structure shared in the 2×2 pattern by pixels 601 to 604 having the split-type pixel structure of FIG. 5A. In FIG. 5A, since a number of floating diffusion nodes FD0 is different from a number of floating diffusion nodes FD1, the sensitivity may be changed depending on whether a phase is 0° or 180°. To prevent a change in the sensitivity, in the pixel structure of FIG. 6, the pixels 601 to 604 may be operated as a single pixel. Here, the pixels 601 to 604 may share floating diffusion nodes FD0 and FD1 and accordingly, a number of floating diffusion nodes FD0 may be equal to a number of floating diffusion nodes FD1. For example, as shown in FIG. 6, five floating diffusion nodes FD0 and five floating diffusion nodes FD1 may be shared.

Here, in a color mode in which a color image is sensed, the pixels 601 to 604 may be individually operated. In a depth mode in which a depth image is sensed, the pixels 601 to 604 may be operated as a single pixel.

Figure 7:
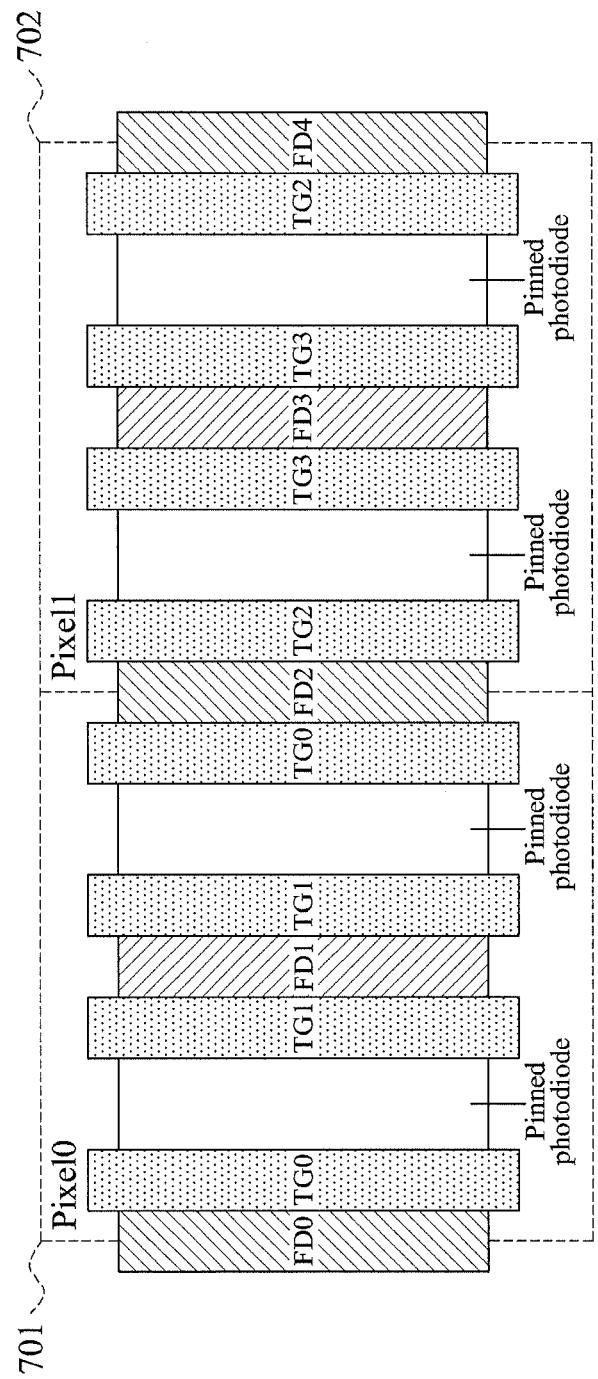
FIG. 7 illustrates a diagram of a pattern in which a floating diffusion node is shared by pixels having a split-type pixel structure according to example embodiments.

FIG. 7 illustrates a diagram of a pattern in which a floating diffusion node is shared by pixels having a split-type pixel structure according to example embodiments.

Specifically, FIG. 7 illustrates a pixel structure with a 2×2 pattern of pixels 701 and 702, in a different manner from FIG. 6. In the pixel structure of FIG. 7, floating diffusion nodes may be different in type from those of the pixel structure of FIG. 6. Specifically, in the pixel structure of FIG. 6, floating diffusion nodes in both sides in a single pixel may be of the same type. However, in the pixel structure of FIG. 7, floating diffusion nodes in both sides in a single pixel may be of different types.

FIG. 8 illustrates a diagram of a split-type pixel structure with a phase difference of 180° according to example embodiments.

Referring to FIG. 8, a pixel structure that includes pixels 801, 802, and 803 and that has a phase of 0° may be deviated by ½ pixel from a pixel structure that includes pixels 804, 805, and 806 and that has a phase of 180°. Accordingly, a resolution of a depth image may be reduced.

Figure 9A:
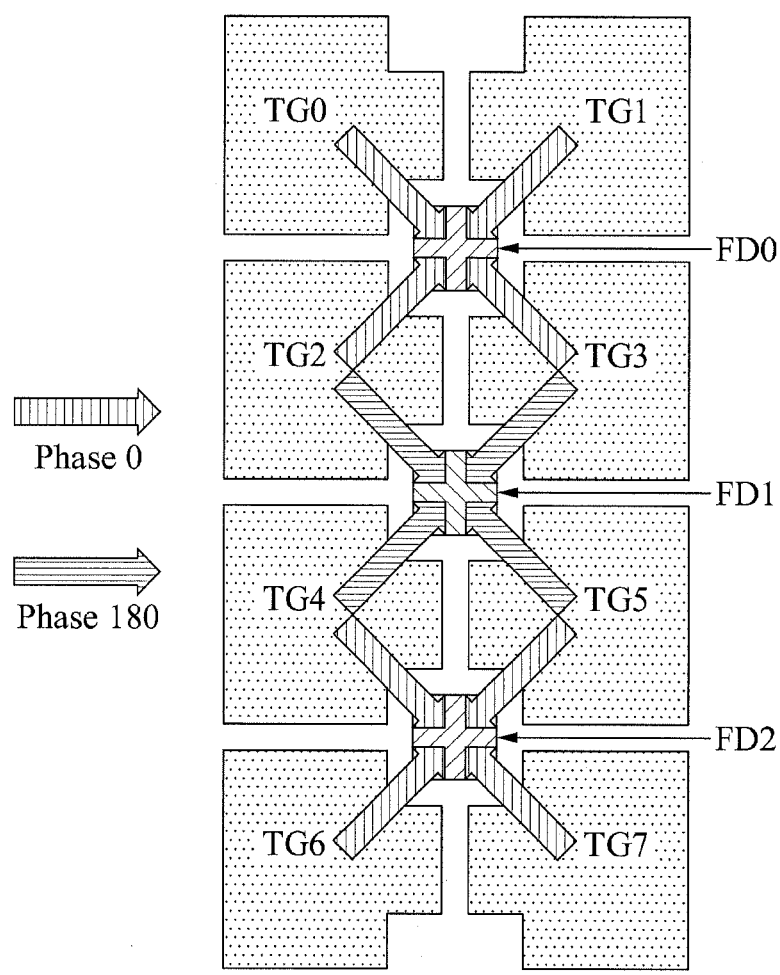
FIGS. 9A and 9B illustrate diagrams of pixel structures in which floating diffusion nodes are shared according to example embodiments.
Figure 9B:
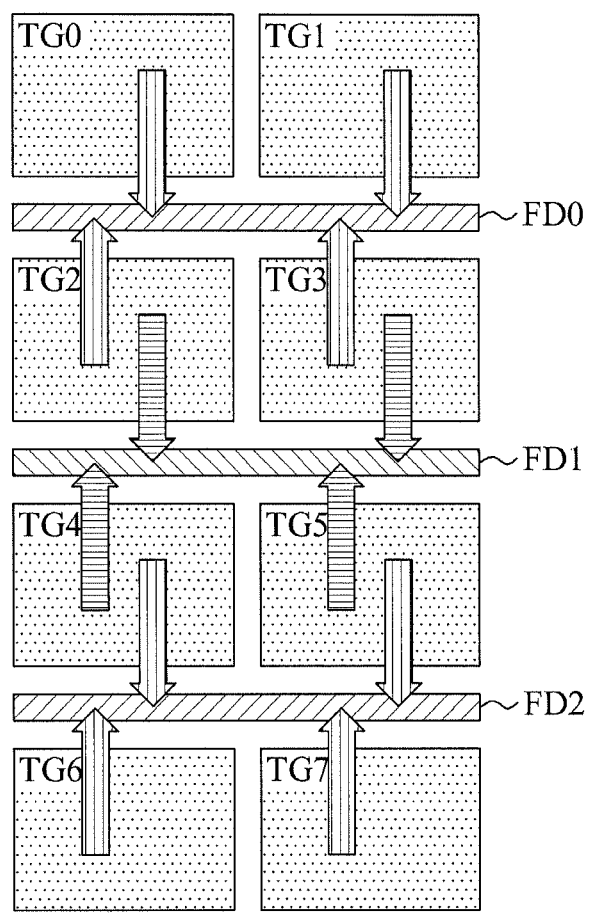

FIGS. 9A and 9B illustrate diagrams of pixel structures in which floating diffusion nodes are shared according to example embodiments.

The pixel structures of FIGS. 9A and 9B may be applied to all types of pixel structures, as well as a split-type pixel structure. Specifically, the pixel structures of FIGS. 9A and 9B in which floating diffusion nodes are shared may be applied even when transfer gates have different shapes. Here, two generated images may be deviated from each other by a single pixel. However, an area of a photodiode may be widened by sharing the floating diffusion nodes and thus, it is possible to improve the sensitivity.

Figure 10:
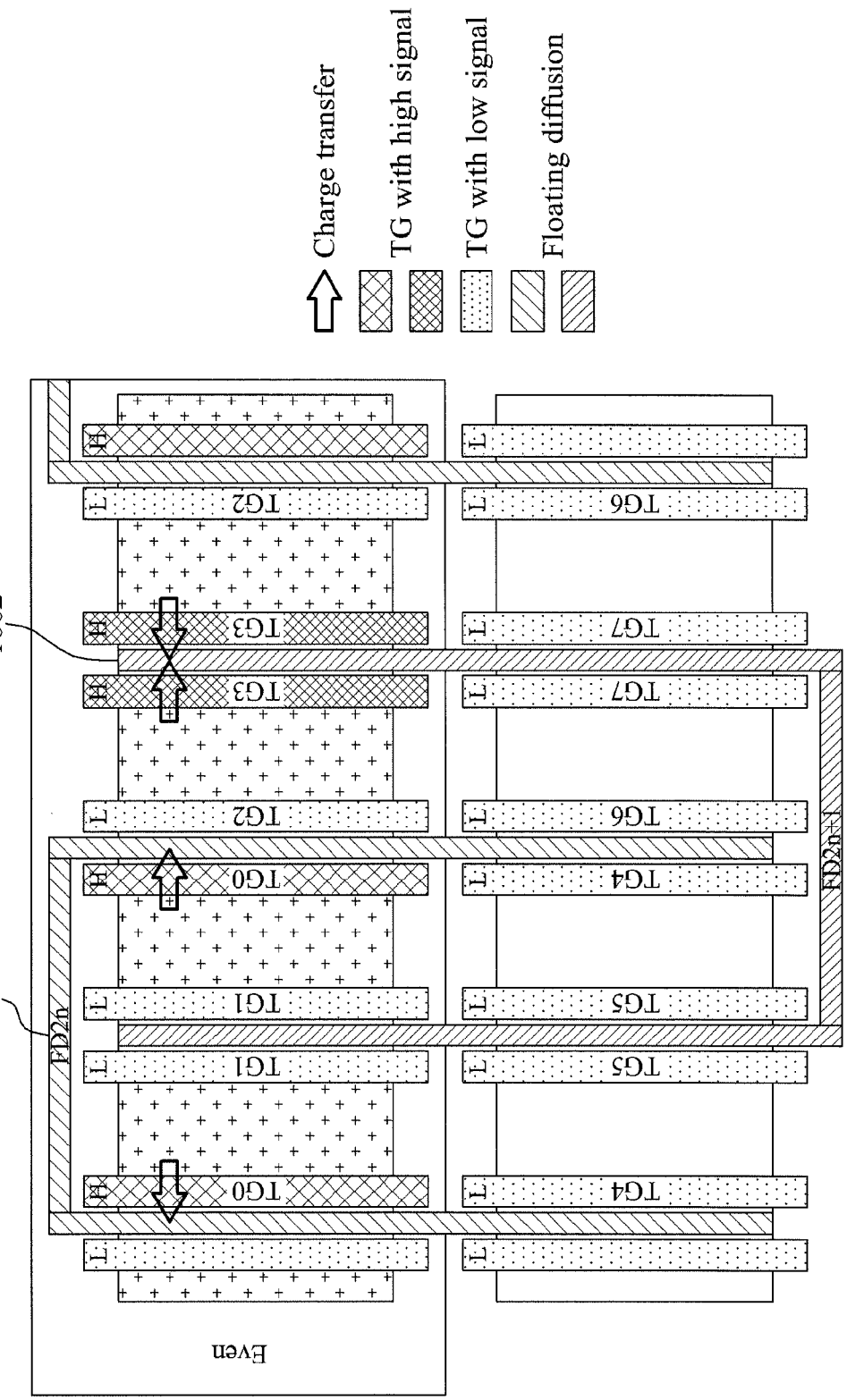
FIG. 10 illustrates a diagram of an operation of acquiring a color image from pixels placed in an even row according to example embodiments.

FIG. 10 illustrates a diagram of an operation of acquiring a color image from pixels placed in an even row according to example embodiments.

Referring to FIG. 10, pixels corresponding to an even row, and pixels corresponding to an odd row may share floating diffusion nodes 1001 and 1002. First, when the pixels corresponding to the even row are operated, transfer gates TG0, TG1, TG2, and TG3 may be turned on. Additionally, a floating diffusion node shared with a pixel on a left side of each of the pixels corresponding to the even row may be different from a floating diffusion node shared with a pixel on a right side of each of the pixels corresponding to the even row.

For example, a first pixel among the pixels corresponding to the even row may share the floating diffusion node 1001 with a pixel on a left side of the first pixel, and may share the floating diffusion node 1002 with a pixel on a right side of the first pixel. Similarly, a second pixel among the pixels corresponding to the even row may share the floating diffusion node 1002 with a pixel on a left side of the second pixel, and may share the floating diffusion node 1001 with a pixel on a right side of the second pixel.

An electron moving to the floating diffusion node 1001 via the transfer gate TG0 may represent a high signal. Similarly, an electron moving to the floating diffusion node 1002 via the transfer gate TG3 may represent a high signal.

Conversely, an electron moving to the floating diffusion node 1002 via the transfer gate TG1 may represent a low signal. Additionally, an electron moving to the floating diffusion node 1001 via the transfer gate TG2 may represent a low signal. The transfer gates TG0, TG1, TG2, and TG3 may be operated by a rolling shutter scheme.

FIG. 11 illustrates a diagram of an operation of acquiring a color image from pixels placed in an odd row according to example embodiments.

Referring to FIG. 11, pixels corresponding to an even row, and pixels corresponding to an odd row may share floating diffusion nodes 1101 and 1102. First, when the pixels corresponding to the odd row are operated, transfer gates TG4, TG5, TG6, and TG7 may be turned on.

Additionally, a floating diffusion node shared with a pixel on a left side of each of the pixels corresponding to the odd row may be different from a floating diffusion node shared with a pixel on a right side of each of the pixels corresponding to the odd row.

For example, a first pixel among the pixels corresponding to the odd row may share the floating diffusion node 1101 with a pixel on a left side of the first pixel, and may share the floating diffusion node 1102 with a pixel on a right side of the first pixel. Similarly, a second pixel among the pixels corresponding to the odd row may share the floating diffusion node 1102 with a pixel on a left side of the second pixel, and may share the floating diffusion node 1101 with a pixel on a right side of the second pixel.

An electron moving to the floating diffusion node 1101 via the transfer gate TG4 may represent a high signal. Similarly, an electron moving to the floating diffusion node 1102 via the transfer gate TG7 may represent a high signal.

Conversely, an electron moving to the floating diffusion node 1102 via the transfer gate TG5 may represent a low signal. Additionally, an electron moving to the floating diffusion node 1101 via the transfer gate TG6 may represent a low signal. The transfer gates TG4, TG5, TG6, and TG7 may be operated by the rolling shutter scheme.

According to example embodiments, a transfer gate and a photodiode may be enabled to be included in a pixel, and a manufacturing process of manufacturing a color sensor may equally be used to manufacture a depth sensor, thereby reducing manufacturing costs.

Additionally, according to example embodiments, a transfer gate and a photodiode may be enabled to be included in a pixel and thus, it is possible to obtain a TOF requiring a fast electron transfer.

Example embodiments are described herein as being applicable to an image sensor. However, embodiments are not limited to being applicable to an image sensor. Instead, embodiments are applicable to apparatuses other than an image sensor.

The methods according to the above-described example embodiments may be recorded in non-transitory computer-readable media including program instructions to implement various operations embodied by a computer. The media may also include, alone or in combination with the program instructions, data files, data structures, and the like. The program instructions recorded on the media may be those specially designed and constructed for the purposes of the example embodiments, or they may be of the kind well-known and available to those having skill in the computer software arts.

Although example embodiments have been shown and described, it would be appreciated by those skilled in the art that changes may be made in these example embodiments without departing from the principles and spirit of the disclosure, the scope of which is defined in the claims and their equivalents.

What is claimed is:

1. An image sensor comprising:
a pixel structure including
   a photodiode, and
   transfer gates located in each side of the photodiode,
wherein the transfer gate include a first transfer gate and a second transfer gate,
wherein the first transfer gate is configured to transfer an electron generated during a first time interval to a first floating diffusion node, and the second transfer gate is configured to transfer an electron generated during a second time interval to a second floating diffusion node, and
wherein the first time interval and the second time interval have difference phases.

2. The image sensor of claim 1, wherein the transfer gates comprise the first transfer gate located in one half of the sides of the photodiode, and the second transfer gate located in the other half of the sides of the photodiode.

3. The image sensor of claim 2, wherein
the first transfer gate is adjacent to the first floating diffusion node used to accumulate an electron generated by a light reflected from an object, and
the second transfer gate is adjacent to the second floating diffusion node used to accumulate an electron generated by a light reflected from an object.

4. The image sensor of claim 1, wherein
a phase difference between the first time interval and the second time interval is 180°.

5. The image sensor of claim 1, wherein the photodiode comprises a pinned photodiode.

6. An image sensor comprising:
a pixel structure comprising
a photodiode, and
different transfer gates respectively located in two sides of the photodiode,
wherein the different transfer gates include a first transfer gate and a second transfer gate, and
wherein the first transfer gate is configured to transfer an electron to a first floating diffusion node or the second transfer gate is configured to transfer the electron to a second floating diffusion node, based on whether the first transfer gate and the second transfer gate are turned on or off.

7. The image sensor of claim 6, wherein the different transfer gates comprise the first transfer gate located in one side of the two sides, and the second transfer gate located in the other side of the two sides.

8. The image sensor of claim 7, wherein
the first transfer gate is adjacent to the first floating diffusion node used to accumulate an electron generated by a light reflected from an object, and
the second transfer gate is adjacent to the second floating diffusion node used to accumulate an electron generated by a light reflected from an object.

9. The image sensor of claim 6, wherein
the electron is generated by a light reflected from an object.

10. An image sensor comprising:
a pixel structure comprising
   a photodiode, and
   different transfer gates respectively located in two facing sides of the photodiode,
wherein the different transfer gates include a first transfer gate and a second transfer gate, and
wherein the first transfer gate is configured to transfer an election to a first floating diffusion node or the second transfer gate is configured to transfer the electron to a second floating diffusion node, based on whether the first transfer gate and the second transfer gate are turned on or off.

11. The image sensor of claim 10, wherein
the different transfer gates comprise the first transfer gate located in one side of the two facing sides, and the second transfer gate located in the other side of the two facing sides, and
the first transfer gate and the second transfer gate are formed to protrude to a center portion of the photodiode.

12. The image sensor of claim 11, wherein
the first transfer gate is adjacent to the first floating diffusion node used to accumulate an electron generated by a light reflected from an object, and
the second transfer gate is adjacent to the second floating diffusion node used to accumulate an electron generated by a light reflected from an object.

13. The image sensor of claim 10, wherein
the electron is generated by a light reflected from an object, and is moved to the center portion of the photodiode.

14. An image sensor comprising:
a pixel structure including
a photodiode, and
a transfer gate and a floating diffusion node dividing the photodiode into at least two segments,
wherein pixel structures sharing a floating diffusion node are deviated from each other so that pixel structures have difference phases.

15. The image sensor of claim 14, wherein the floating diffusion node is smaller in size by a preset ratio than the transfer gate.

16. The image sensor of claim 14, wherein
the image sensor comprises a plurality of the pixel structures that share floating diffusion nodes.

17. The image sensor of claim 16, wherein
the image sensor is configured to individually operates the plurality of pixel structures in a color mode in which a color image is sensed, and
the image sensor is configured to operates the plurality of pixel structures as a single pixel in a depth mode in which a depth image is sensed.

18. The image sensor of claim 16, wherein pixel structures sharing a floating diffusion node are deviated from each other by ½ pixel so that a phase difference is 180°.

19. The image sensor of claim 14, wherein either a same floating diffusion node or different floating diffusion nodes are located in a boundary of a pixel comprising the pixel structure.

20. An image sensor, comprising:
a plurality of pixel structures to enable a transfer gate to transfer, to a floating diffusion node, an electron generated by a light reflected from an object,
wherein the plurality of pixel structures each include a photodiode, and share the floating diffusion node with each other,
wherein the transfer gate include a first transfer gate and a second transfer gate,
wherein the first transfer gate is configured to transfer an electron generated during a first time interval to a first floating diffusion node, and the second transfer gate is configured to transfer an electron generated during a second time interval to a second floating diffusion node, and
wherein the first time internal and the second time have difference phases.

21. An image sensor, comprising:
pixels corresponding to an odd row, and pixels corresponding to an even row, the pixels enabling a transfer gate to transfer, to a floating diffusion node, an electron generated by a light reflected from an object,
wherein the pixels each include a photodiode, and the pixels corresponding to the odd row and the pixels corresponding to the even row share the floating diffusion node with each other.

22. The image sensor of claim 21, wherein a floating diffusion node shared with a pixel on a left side of each of the pixels is different from a floating diffusion node shared with a pixel on a right side of each of the pixels.

23. An apparatus comprising:
a pixel structure including a photodiode having first and second sides, and transfer gates located in the first and second sides,
wherein the transfer gate include a first transfer gate and a second transfer gate,
wherein the first transfer gate is configured to transfer an electron generated during a first time interval to a first floating diffusion node, and the second transfer gate is configured to transfer an electron generated during a second time interval to a second floating diffusion node, and
wherein the first time internal and the second time have difference phases.

24. An apparatus as in claim 23, wherein the transfer gates include the first transfer gate located in the first side and the second transfer gate located in the second side.

25. An apparatus as in claim 24, wherein the pixel structure is a diamond-type pixel structure.

26. An apparatus as in claim 23, wherein
the photodiode includes third and fourth sides, and
transfer gates located in the third and fourth sides.

27. An apparatus as in claim 23, wherein the photodiode includes third and fourth sides, and the transfer gates include a first transfer gate located in the first and second sides, and a second transfer gate located in the third and fourth sides.

28. An apparatus as in claim 27, wherein the first and second sides are adjacent to each other, and the third and fourth sides are adjacent to each other.

29. An apparatus as in claim 27, wherein the pixel structure is a cover-type pixel structure.

30. An apparatus as in claim 23, wherein the pixel structure is a cover-type pixel structure or a diamond-type pixel structure.

31. An apparatus as in claim 30, wherein the apparatus is an image sensor.

32. An apparatus as in claim 23, wherein the apparatus is an image sensor.

* * * * *